(12) United States Patent
Chen et al.

(10) Patent No.: US 7,394,272 B2
(45) Date of Patent: Jul. 1, 2008

(54) BUILT-IN SELF TEST FOR SYSTEM IN PACKAGE

(75) Inventors: Wang-Jin Chen, Kaohsiung County (TW); Aviles Chang, Hsinchu County (TW)

(73) Assignee: Faraday Technology Corp., Hsin-Chu (TW)

( * ) Notice: Subject to any disclaimer, the term of this patent is extended or adjusted under 35 U.S.C. 154(b) by 6 days.

(21) Appl. No.: 11/306,773

(22) Filed: Jan. 11, 2006

(65) Prior Publication Data
US 2007/0159201 A1 Jul. 12, 2007

(51) Int. Cl.
*G01R 31/02* (2006.01)

(52) U.S. Cl. ...................................... 324/763

(58) Field of Classification Search ................. 324/763, 324/765; 714/718, 733–734; 365/201
See application file for complete search history.

(56) References Cited
U.S. PATENT DOCUMENTS 5,517,515 A    5/1996  Spall et al. .................. 714/733
6,111,414 A    8/2000  Chatterjee et al. ............ 324/633
6,465,336 B2  10/2002  Gabara et al. ................ 438/599
6,505,317 B1 * 1/2003  Smith et al. .................. 714/738
6,651,198 B1  11/2003  Wang ........................... 714/726
2003/0065997 A1 * 4/2003 Yamazaki et al. ............ 714/718
2004/0177296 A1 * 9/2004 Saito ........................... 714/724

* cited by examiner

Primary Examiner—Ha Nguyen
Assistant Examiner—Joshua Benitez
(74) Attorney, Agent, or Firm—Winston Hsu

(57) ABSTRACT

A SIP (system in package) with a chip and a memory mode, capable of performing integration test on the memory module even if the memory module does not include any scan chain is provided. The chip has a built-in self-test (BIST) circuit, which generates test pattern signals to test the memory module in response to a mode signal. Under a test mode, after the memory module receives the test pattern signals, the memory module outputs responsive readout signals to the BIST circuit and the BIST circuit determines and outputs a test result and a test record in response to the readout signals. If the test fails, conditions of the faulty memory module are recognized from the test record.

12 Claims, 2 Drawing Sheets

BUILT-IN SELF TEST FOR SYSTEM IN PACKAGE

BACKGROUND OF THE INVENTION

1. Field of Invention

The present invention relates to a configuration of SIP (System In Package), more particularly to a test configuration of the SIP for enhancing integration or interconnection scan test of memory modules in the SIP.

2. Description of Related Art

Nowadays electronic devices, such as: mobile phones, PDAs (personal digital assistants) and on the likes are required to be compact and weight-light; therefore, a SIP (System In Package) technique is developed. In SIP, several chips or ICs or memory modules are integrated into one package, such as: ASIC (Application Specific Integrated Circuit) and a flash memory (memory module) packaged together to reduce the size as whole. Before being packaged, the ASIC and the flash memory are tested respectively and integrated together when they pass the test. Though the ASIC and the flash memory are good dies before being packaged, they have to be tested again after being packaged. But it is difficult to automatically generate suitable test patterns for the SIP integrating the ASIC and the flash memory.

In prior art, a boundary scan test method is used for interconnection (integration) testing between ASIC and the flash memory in the SIP. To support boundary scan, the ICs must contain scan chain. However, the boundary scan test is not applicable to the flash memory, which does not have the corresponding scan chain circuit. Additionally, it is difficult to automatically create functional patterns for the interconnection test because each creation of pattern is case-specific.

Therefore, a built-in self test (BIST) circuit in the ASIC for automatically generating suitable read/write test patterns based on memory type is required. The testability for the integration of the ASIC and the memory device in SIP is enhanced by this BIST circuit.

SUMMARY OF THE INVENTION

One of the aspects of the invention is to provide a SIP with built-in self-test circuit for enhancing the integration test of memory in SIP.

Another aspect of the invention is to provide an easy and low-cost test circuit and configuration for testing in the SIP containing memory modules.

To at least achieve the above and other aspects, one embodiment of the invention provides a SIP (system in package) including a chip and a memory mode, capable of performing integration test on the memory module even if the memory module does not include any scan chain. The chip has a built-in self test (BIST) circuit, which generates test pattern signals to test the memory module in response to a mode signal. Under a test mode, after the memory module receives the test pattern signals, the memory module outputs responsive readout signals to the BIST circuit and the BIST circuit determines and outputs a test result and a test record in response to the readout signals. If the test result fails, conditions of the faulty memory module are recognized from the test record.

Furthermore, another embodiment of the invention discloses a built-in self-test (BIST) circuit of a chip in a SIP (system in package). The chip and a memory module, which does not include any scan chain, are integrated and packaged into the SIP. The BIST circuit performs integration boundary scan test on the memory module. The BIST circuit includes a test pattern generator, a signal selector and a comparator. The test pattern generator generates test pattern signals based on a mode signal and the type of the memory module. The signal selector is a multiplexer, which selects and processes normal mode memory signals or the test pattern signals to the memory module in response to the mode signal. The comparator receives the test pattern signals from the test pattern generator. If the memory module is under the test, the memory signal selector processes the test pattern signals from the test pattern generator to the memory module and the comparator receives the output signals from the memory module to determine results of such a test.

It is to be understood that both the general description above and the following detailed description are exemplary, and are intended to provide further explanation of the invention as claimed.

BRIEF DESCRIPTION OF THE DRAWINGS

The accompanying drawings are included to provide a further understanding of the invention, and constitute part of this specification. The drawings illustrate embodiments of the invention and, together with the description, serve to explain the principles of the invention.

DESCRIPTION OF THE PREFERRED EMBODIMENTS

Figure 1:
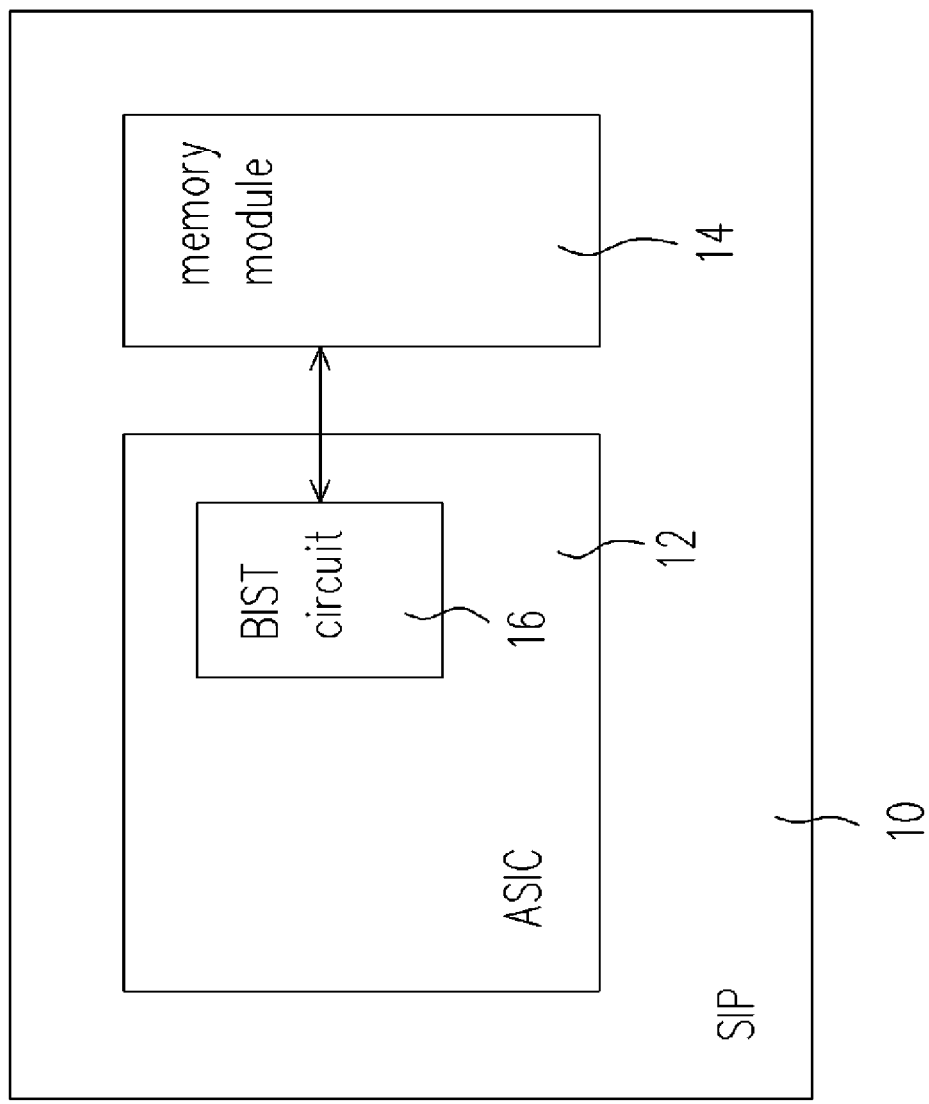
FIG. 1 is a SIP (System in Package) diagram according to one embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

In one embodiment of the invention, a BIST (Built-In Self Test) circuit is in a memory I/O (Input/Output) interface of an ASIC of the SIP, wherein the SIP at least includes the ASIC and a memory module. The memory module does not include any scan chain for integration boundary test. The memory module is, but not limited to, a DDR (dual date rate) memory module.

Please refer to FIG. 1, which is a SIP (System in Package) diagram according to one embodiment of the invention. The SIP 10 at least includes an ASIC 12 and a memory module 14. The ASIC 12 is a SOC (System on a Chip). The memory module 14 is embedded outside of the ASIC 12. The memory module 14 does not include any scan chain while the ASIC includes a BIST circuit 16 for enhancing the interconnection test between the ASIC and the memory module.

Figure 2:
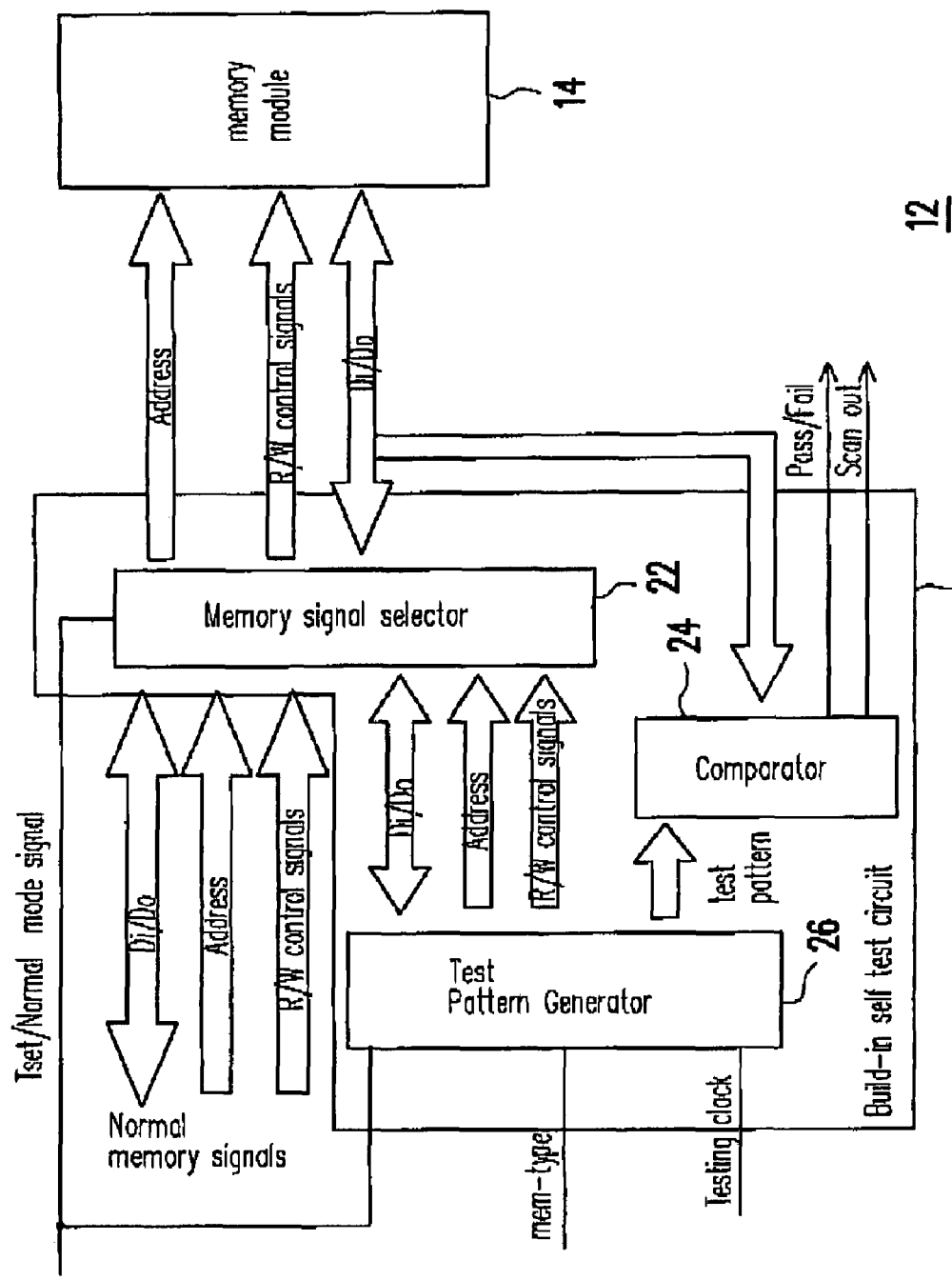
FIG. 2 is a block diagram of a BIST (Built-In Self Test) circuit according to the embodiment of the invention.

FIG. 2 is a block diagram of the BIST (Built-In Self Test) circuit according to the embodiment of the invention. The BIST circuit 16 includes a memory signal selector 22, a comparator 24 and a test pattern generator 26. "Di/Do" refers to memory data input and data output signals. "Address" means the address signals of the memory module. "R/W control signals" means read or write control signals for controlling the memory module.

The memory signal selector 22 is a memory data/address/control signal multiplexer, which selects signals from the corresponding components (not shown herein) of the ASIC or from the test pattern generator 26. The selector 22 selects and processes the normal memory signals or the test pattern signals to the memory module 14. The memory signal selector 22 is controlled by a test/normal mode signal, which is provided by other components (not shown herein) of the ASIC 12. The test/normal mode signal indicates whether the SIP, the ASIC and the memory module operated in test mode or normal mode. In normal mode, the memory signal selector 22 selects and processes Di/Do signals, address signals and R/W control signals of the normal memory signals from the ASIC to the memory module 14. On the other hand, in test mode, the memory signal selector 22 selects and processes Di/Do signals, address signals and R/W control signals from the test pattern generator 26 to the memory module 14.

The comparator 24 receives test patterns from the test pattern generator 26 and the feedback Di/Do signals from the memory module to determine whether the read/write operations of the memory module incorrect or not and the comparator 24 outputs Pass/Fail signals and Scan out signals based the result. The Pass/Fail signals are outputt test result indicating the test result. The scan out signals are used for scanning out the test result if the test fails. When the test fails, the scan out signals can check which or how read/write operations or storage cells of the memory module fails. Additionally, the scan out signals does not matter if the test is passed. The configuration of the comparator 24 is not specially limited, for instance, a Cyclic-Redundancy Check (CRC) circuit used as the comparator 24.

The test pattern generator 26 receives the test/normal mode signal and generates test patterns to the memory signal selector 22 when the test/normal mode signal indicates a test mode. The test patterns at least include the Di/Do signals, the address signals and the R/W control signals. In addition, the test pattern generator 26 receives a testing clock in generating the test patterns. The test pattern generator 26 generates the test patterns based on, but not limited to, a mem_type signal indicating the type of the memory module. Furthermore, the test pattern generator 26 is programmable in response to the mem_type signal. If the type of the memory module changes, the test pattern generator 26 generates suitable test patterns accordingly.

However, if the memory type is already known, the configuration of the test pattern generator 26 can be fixed for reducing circuit size thereof.

The operation of the embodiment is described referring to FIGS. 1 and 2. When the test/normal mode signal indicates that SIP operated in normal mode, the memory signal selector 22 selects and processes Di/do signals, address signals and R/W control signals of the normal memory signals to the memory module 14. When in normal mode, the comparator 24 and the test pattern generator 26 are not in operation.

When the test/normal mode signal indicates that SIP is operated in test mode, the memory signal selector 22 selects and processes Di/do signals, address signals and R/W control signals of the test patterns generated from the test pattern generator 26 to the memory module 14. If the R/W control signals indicates the read operation, the memory module 14 reads and outputs data. In addition, the comparator 24 receives the Di/Do signals including the readout data from the memory module 14. Since the comparator 24 also receives the test pattern from the test pattern generator 26, the comparator 24 can determine whether the readout data from the memory module 14 correct or not. The comparator 24 outputs the Pass/Fail signal indicating the test result. If the test result fails, the comparator 24 further outputs the scan out signals. The scan out signal is used to recognize which operations and storage cells of the memory module 14 fails.

As discussed above, even if the memory module does not have any scan chain for boundary scan test, the embodiment of the invention can provide a BIST circuit in the input/output interface of the ASIC for boundary scan tests on the memory module without the scan chains.

Furthermore, because the test patterns are generated by the hardware, such as: the test pattern generator of FIG. 2, it is easy to automatically create functional patterns for integration test.

With the embodiment above, the testability of the SIP including the ASIC and the memory module is enhanced because the memory module is automatically tested even if the memory module does not include any scan chain.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A built-in self test circuit of a chip on a SIP (system in package), the SIP further including a memory module coupled to the chip, the built-in self test circuit comprising:
   a test pattern generator, generating test pattern signals based on a mode signal and the type of the memory module, the mode signal at least indicating a test mode and a normal mode;
   a signal selector, selecting and processing normal mode memory signals from the memory module under the normal mode, selecting and processing the test pattern signals from the test pattern generator to the memory module under the test mode, in response to the mode signal; and
   a comparator, receiving the test pattern signals from the test pattern generator;
   wherein in case of the mode signal indicating a test mode, the memory signal selector processes the test pattern signals from the test pattern generator to the memory module and the comparator receives output signals from the memory module to determine the test result; the test result being used for checking which read/write operations and which storage cells of the memory module fail.

2. The built-in self test circuit of claim 1, wherein the test pattern generator further receives a test clock.

3. The built-in self test circuit of claim 1, wherein the comparator outputs a pass/fail signal for indicating the test result.

4. The built-in self test circuit of claim 3, wherein the comparator outputs a scan out signal if the test fails.

5. The built-in self test circuit of claim 1, wherein the normal mode memory signals at least include data input/output signals, address signals and read/write control signals.

6. The built-in self test circuit of claim 1, wherein the test pattern signals at least include data input/output signals, address signals and read/write control signals.

7. A configuration of SIP (system in package), comprising:
   a memory module; and
   a chip, including a self test circuit, the self test circuit generating test pattern signals based on a mode signal and the type of the memory module to test the memory module in response to a mode signal produced by the chip, the mode signal at least indicating a test mode and a normal mode, the self test circuit selecting and processing normal mode memory signals from the memory module under the normal mode, selecting and processing the test pattern signals to the memory module under the test mode, in response to the mode signal;
   wherein in case of the mode signal indicating a test mode, after the memory module receives the test pattern signals, the memory module outputs readout signals to the self-test circuit accordingly, and the self test circuit determines and outputs a test result and such a test record in response to the readout signals to complete the test mode; and if the test fails, the test result and the test record from the self test circuit is used for checking which read/write operations and which storage cells of the memory module fail.

8. The configuration of claim 7, wherein the self test circuit comprises:

a test pattern generator, generating the test pattern signals based on the mode signal and the type of the memory module;

a signal selector, selecting and processes normal mode memory signals from the memory module under the normal mode, selecting and processing the test pattern signals from the test pattern generator to the memory module under the test mode, in response to the mode signal; and a comparator, receiving the test pattern signals from the test pattern generator;

wherein the memory signal selector processes the test pattern signals from the test pattern generator to the memory module and the comparator receives the responsive readout signals from the memory module to determine the test results if the mode signal indicating the test mode.

9. The configuration of claim 8, wherein the comparator outputs a pass/fail signal for indicating the test result.

10. The configuration of claim 8, wherein the comparator outputs a scan out signal including the test result if the test fails.

11. The configuration of claim 7, wherein the normal mode memory signals at least include data input/output signals, address signals and read/write control signals.

12. The configuration of claim 7, wherein the test pattern signals at least include data input/output signals, address signals and read/write control signals.

\* \* \* \* \*